United States Patent [19]

Bellin

[11] Patent Number: 5,081,370
[45] Date of Patent: Jan. 14, 1992

[54] TYPE "B" FLIP-FLOP

[75] Inventor: Michele Bellin, Basiglio, Italy

[73] Assignee: Alcatel N.V., Amsterdam, Netherlands

[21] Appl. No.: 544,537

[22] Filed: Jun. 28, 1990

[30] Foreign Application Priority Data

Jul. 4, 1989 [IT] Italy .............................. 21088 A/89

[51] Int. Cl.⁵ .................. H03K 3/30; H03K 3/29; H03K 19/21; H03K 17/16
[52] U.S. Cl. .................................. 307/276; 307/290; 307/292; 307/471; 307/443
[58] Field of Search ............... 307/276, 443, 601, 605, 307/290, 292, 471

[56] References Cited

U.S. PATENT DOCUMENTS 4,540,903  9/1985  Cooke et al. .................... 307/269
4,749,937  6/1988  Simons ............................. 324/83 D

FOREIGN PATENT DOCUMENTS 0198677  10/1986  European Pat. Off. .
0310377   4/1989  European Pat. Off. .
0052019   3/1986  Japan ................................ 307/276
2123634A  2/1984  United Kingdom .

Primary Examiner—Stanley D. Miller
Assistant Examiner—Trong Phan
Attorney, Agent, or Firm—Spencer & Frank

[57] ABSTRACT

A circuit device for transforming a type "D" flip-flop into a type "B" flip-flop is able to sample data both on leading and trailing edges of the clock signal. It has a first type "D" flip-flop, at whose clock input is electrically connected an exclusive OR gate. To this first type "D" flip-flop is connected a second "D"-type flip-flop identical to the first one which, being also connected with the exclusive OR output, allows realization of a type "B" flip-flop.

4 Claims, 1 Drawing Sheet

TYPE "B" FLIP-FLOP

BACKGROUND OF THE INVENTION

The invention relates to a circuit device for transforming a type "D" flip-flop into a flip-flop called type "B" able to sample data both on leading and trailing edges of the clock signal and comprises an exclusive OR gate whose output is electrically connected to the clock input of a type "D" flip-flop, and delay circuit means, also electrically connected with the exclusive OR gate.

As it is known, in the field of circuital components, a problem arises in using a type "D" flip-flop since it is not able to sample data at its input on both leading and trailing edges of the clock signal.

This limitation is, overcome according to a first circuit configuration in which the clock input of a type "D" flip-flop is electrically connected to the output of an exclusive OR gate, at one input of which is a delay element with which it is possible to obtain a pulse of a particular duration on the clock input of the type "D" flip-flop itself.

This delay element can be realized either by a delay line or by gates in cascade. In the first case, a rather short delay time is produced, in the second case a rather long delay time is produced.

Relative to the delay line, the delay time, value is usually known, but the procedure for obtaining it involves a very high cost not comparable with the cost of the flip-flop itself.

For rather long delay times, it is not possible to calibrate such a parameter a priori, except in a rather approximate manner, because it depends on temperature and on parameter spread of the logic components used; besides, the theoretical delay time can change only in a discrete manner according to the number of gates used in the circuit.

However, the choice of delay time value is not a negligible factor in that the qualitative performance of the flip-flop is reflected by both maximum toggle frequency and minimum pulse width.

More particularly, the correct choice of delay time value is important in that it depends on which considerations are made in order to calibrate the minimum duration of the signal to be sampled, as well as functional in performance of the flip-flop to be used. For instance, if "D" indicates the minimum duration of the signal to be sampled, it is necessary to use a flip-flop with a maximum toggle frequency greater than 2/D.

From this it follows that the ideal value of delay time is situated between the minimum pulse width and D/2.

SUMMARY OF THE INVENTION

For solving such problems, it has been proposed to embody in a single circuit a flip-flop identical to the type "D" flip-flop previously mentioned which, by means of a suitable delay line, allows to follow the same time variations as a function of supply voltage and temperature.

By exploiting such measures, the object of the present invention is to eliminate the above mentioned drawbacks relative to the prior art devices, by realizing and providing a circuital device for transforming a type "D" flip-flop, into a type "B" flip-flop able to sample data at its input both on the leading and trailing edge of the clock signal, making the delay element for timing no longer critical, since it adapts itself automatically to timing requirements of the flip-flop used.

This object and others which will be more apparent from the following are achieved according to the present invention by means of a circuit for transforming a type "D" flip-flop into a flip-flop called type "B" able to sample data at its input both on leading and trailing edges of the clock signal, of the type comprising an exclusive OR gate, whose output is electrically connected to the clock input of a first type "D" flip-flop, and a delay circuit means electrically connected to the exclusive OR gate too, said device being characterized in that said delay means consists of a second type "D" flip-flop, said first flip-flop having outputs QN, Q which are respectively the outputs QN, Q of the flip-flop called type "B", input D which is the input B of the flip-flop called type "B" and the clock input which is connected to the exclusive OR gate, the latter having two inputs, the first one being the clock input of the flip-flop called type "B" and the second one being electrically connected to the input D of said second flip-flop type D, which input D, in turn, is directly connected to the output QN of the same flip-flop.

Further features and advantages of the invention will be more evident from the detailed description of a preferred but not exclusive embodiment of a device for transforming a type "D" flip-flop into a flip-flop called type "B" able to sample data at its input both on leading and trailing edges of the clock signal, taken with reference to the attached drawing, given as an representative and therefore not limiting example, in which there is illustrated a block diagram where the electrical components of the device itself, according to the present invention, are outlined.

BRIEF DESCRIPTION OF THE DRAWINGS

An embodiment of the invention will now be described with reference to the accompanying drawings in which.

DESCRIPTION OF THE PREFERRED EMBODIMENT(S)

Figure 1:
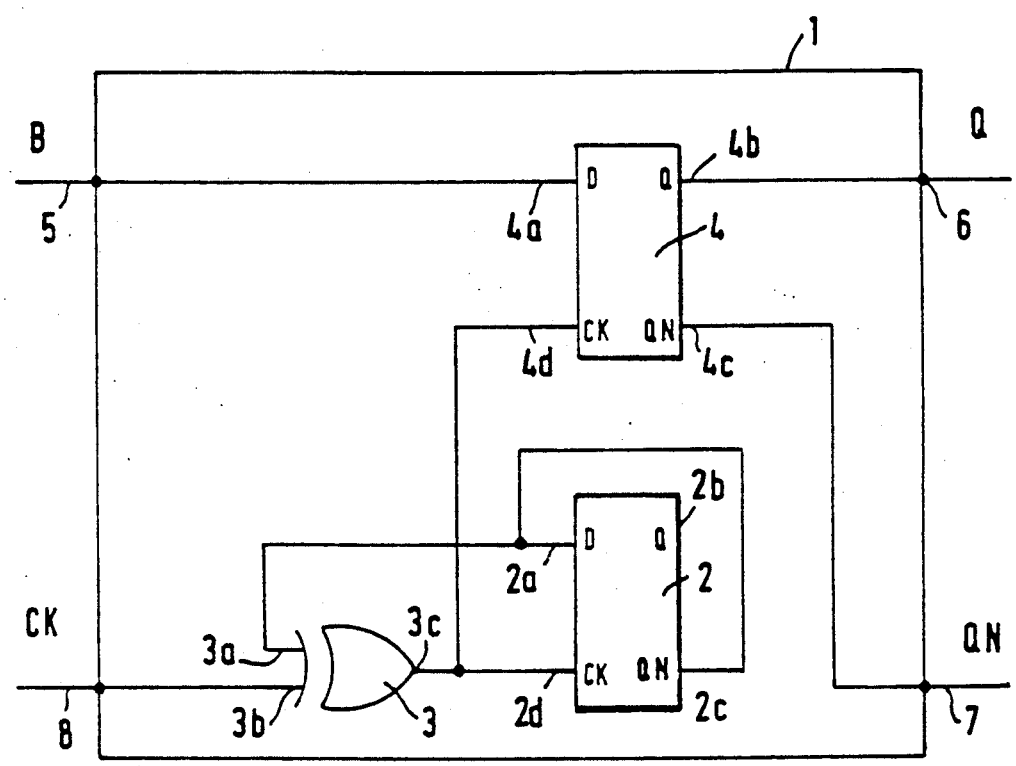
FIG. 1 is a circuit diagram of an embodiment of the present invention.

With reference to such figure, reference numeral 1 indicates, as a whole, the so-called type "B" flip-flop integrated in a single circuit arrangement.

Internally, we may distinguish a first type "D" flip-flop 4, connected with an exclusive OR gate 3 and with a second type "D" flip-flop, identical to the first one, indicated by reference numeral 2.

The type "B" flip-flip 1 has an input B indicated by reference numeral 5, an output Q indicated by reference numeral 6, a second output QN indicated by reference numeral 7, as well as a clock input indicated by reference numeral 8.

The B-input 5 of type "B" flip-flop 1 is connected directly with input D 4a of the first type "D" flip-flop while the output Q 4b of the same type "D" flip-flop, indicated by 4b, is connected directly as the Q-output 6 of type "B" flip-flop 1. The clock input 4d of flip-flop 4 is connected with the output 3c of exclusive OR gate 3, as well as with clock input 2d of flip-flop 2.

The QN output 4c of flip-flop 4 is connected directly as the output QN 7 of type "B" flip-flop 1.

The clock input 8 of type "B" flip-flop 1 is directly connected to one of the inputs 3b of exclusive OR gate 3, while the other input 3a of the exclusive OR gate 3 is connected to the input D 2a of flip-flop 2, which input is directly connected to the QN output 2c of flip-flop 2. The Q output 2b of flip-flop 2, is not connected, while the clock input 2d is connected with the output 3c of exclusive OR gate 3.

After the above description given in a mainly structural terms, the operation of the device according to the present invention is the following.

At each clock transition we have a switching of the flip-flop 4 which acts as a divider by two and hence provides simultaneously for the inversion of the clock input 2d of flip-flop 2, thus predisposing it for the subsequent transition.

Since the propagation delay normally is greater than or equal to the minimum pulse width, it is clear that for both flip-flops, the minimum clock width depends upon the propagation time of flip-flop 2 to which the delay time due to exclusive OR gate 3 must be added.

In more detail, propagation time of flip-flop 2 coincides with the smallest time unit which can be sampled and assigned to the delay element represented by flip-flop 2, whereas the propagation time of exclusive OR gate 3 assures an appropriate tolerance margin.

The time setting of two flip-flops is obtained taking into consideration that the sum of propagation times of flip-flop 2 and exclusive OR gate 3 must be less than half the minimum duration of the pulse to be sampled.

In summary, we come to the conclusion that, if we neglect the exclusive OR gate 3 delay time, the smallest delay time t corresponds to the propagation time of flip-flops 4 and 2.

Thus, the invention fully achieves the proposed objects. Indeed, in this way, it is possible to realize, in an intrinsic manner, a circuit arrangement which would otherwise require, difficult parameter settings of the circuit itself.

Moreover, in this way there is provided a new discrete integrated component called type "B" flip-flop 1 which previously was not available in the field of commercial electronic components and may be used, for instance, in the telecommunications field, as concerns the reread of data flow RZ by a clock which, through the use of a type "B" flip-flop, can work at the same frequency as the flip-flop itself.

It is clear that the use of circuits and/or equivalent circuit components, even if structurally different, as well as technical-practical modifications, are not beyond the protective limits and the inventive sphere of the present invention, as hereinbefore described and herebelow claimed.

I claim:

1. A circuit device for transforming a type "D" into a type "B" flip-flop able to sample data at its input both on leading and trailing edges of the clock signal, comprising:

an exclusive OR gate whose output is electrically connected to the clock input of a first type "D" flip-flop; and a delay circuit means electrically connected to the exclusive OR gate, said delay means comprising a second type "D" flip-flop;

wherein, said second type "D" flip-flop has an output Q which forms the output Q of a type "B" flip-flop, an input D which forms an input B of the type "B" flip-flop, and a clock input which is connected to the output of the exclusive OR gate, the exclusive OR gate having two inputs, the first input forming the clock input of the type "B" flip-flop, and the second input being electrically connected to the input D of said first type "D" flip-flop, which input D, in turn, is connected with the output QN of the first type "D" flip-flop.

2. A circuit device according to claim 1, wherein said device is embodied as a single discrete component integrated on a chip.

3. A circuit for forming a type "B" flip-flop having two inputs and two outputs, comprising:

an exclusive OR gate having a first and second input and an output, the second input forming a second input of the type "B" flip-flop;

a first type "D" flip-flop having a first and second input and a first and second output, the first input forming a first input of the type "B" flip-flop, the second input connected to the output of said exclusive OR gate, and the first and second outputs forming first and second outputs of the type "B" flip-flop, respectively; and a second type "D" flip-flop having a first and second input and a first and second output, the first input being connected to both the second output of the second type "D" flip-flop and to the first input of said exclusive OR gate, and the second input being connected to the output of the exclusive OR gate.

4. The circuit of claim 3, wherein:

the first inputs of the first and second type "D" flip-flops are data inputs, the second inputs of the first and second type "D" flip-flops are clock inputs, and the first and second outputs of the first and second type "D" flip-flops are Q and QN outputs, respectively; and the first input of the first type "D" flip-flop forms a B input of the type "B" flip-flop, the second input of the exclusive OR gate forms a clock input of the type "B" flip-flop, and the Q and QN outputs of the first type "D" flip-flop form Q and QN outputs of the type "B" flip-flop, respectively.

* * * * *